(12) United States Patent
Sato

(10) Patent No.: US 9,741,628 B2
(45) Date of Patent: Aug. 22, 2017

(54) METHOD FOR MANUFACTURING SEMICONDUCTOR MODULE AND INTERMEDIATE ASSEMBLY UNIT OF THE SAME

(71) Applicant: FUJI ELECTRIC CO., LTD., Kawasaki-shi, Kanagawa (JP)

(72) Inventor: Kenichiro Sato, Shiojiri (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 42 days.

(21) Appl. No.: 14/877,334

(22) Filed: Oct. 7, 2015

(65) Prior Publication Data

US 2016/0141214 A1    May 19, 2016

(30) Foreign Application Priority Data

Nov. 18, 2014 (JP) ................ 2014-233644

(51) Int. Cl.
*H01L 25/18* (2006.01)
*H01L 21/66* (2006.01)
(Continued)

(52) U.S. Cl.
CPC .......... *H01L 22/14* (2013.01); *H01L 21/4889* (2013.01); *H01L 23/49811* (2013.01); *H01L 23/49844* (2013.01); *H01L 24/40* (2013.01); *H01L 25/072* (2013.01); *H01L 25/115* (2013.01); *H01L 29/1608* (2013.01);
(Continued)

(58) Field of Classification Search
CPC ....... H01L 23/50; H01L 23/498; H01L 27/06; H01L 25/18; H01L 25/115; H01L 29/872; H01L 29/7393; H01L 29/1608; H01L 22/14; H01L 25/072; H01L 24/40
See application file for complete search history.

(56) References Cited

U.S. PATENT DOCUMENTS 7,304,372 B2 * 12/2007 Hu ...................... H01L 23/3121
257/678
8,441,075 B2 * 5/2013 Ishikawa ................ H01L 27/06
257/197
(Continued)

FOREIGN PATENT DOCUMENTS

JP    H03-174747 A    7/1991
JP    H05-021674 A    1/1993
(Continued)

*Primary Examiner* — Jose R Diaz
(74) *Attorney, Agent, or Firm* — Manabu Kanesaka

(57) ABSTRACT

A method for manufacturing a semiconductor module includes the step of soldering two or more semiconductor elements having substrate materials and heights different from each other to a metal foil disposed at one side of an insulating substrate; connecting a plurality of wiring members, not interconnecting the semiconductor elements, to front face electrodes of the semiconductor elements through solder so that heights from a surface of the insulating substrate to top faces of the wiring members become same level with each other; inspecting a leakage current while applying electricity on each one of semiconductor elements individually through the wiring members; and connecting the top faces of the wiring members with a bus bar.

10 Claims, 8 Drawing Sheets

(51) Int. Cl.

| | | |
|---|---|---|
| *H01L 21/48* | (2006.01) | |
| *H01L 29/16* | (2006.01) | |
| *H01L 29/872* | (2006.01) | |
| *H01L 29/739* | (2006.01) | |
| *H01L 25/11* | (2006.01) | |
| *H01L 23/00* | (2006.01) | |
| *H01L 25/07* | (2006.01) | |
| H01L 23/498 | (2006.01) | |
| H01L 23/057 | (2006.01) | |
| H01L 23/373 | (2006.01) | |

(52) U.S. Cl.
CPC ........ *H01L 29/7393* (2013.01); *H01L 29/872* (2013.01); *H01L 23/057* (2013.01); *H01L 23/3735* (2013.01); *H01L 23/49866* (2013.01); *H01L 25/18* (2013.01); *H01L 2224/40095* (2013.01); *H01L 2224/40137* (2013.01); *H01L 2924/10253* (2013.01); *H01L 2924/10272* (2013.01); *H01L 2924/13055* (2013.01)

(56) References Cited

U.S. PATENT DOCUMENTS

| | | | | |
|---|---|---|---|---|
| 8,441,117 | B2* | 5/2013 | Soyano | ........... H01L 23/04 |
| | | | | 257/693 |
| 9,236,316 | B2* | 1/2016 | Fujino | ........... H01L 23/24 |
| 2008/0150102 | A1 | 6/2008 | Yokomae et al. | |
| 2016/0013163 | A1* | 1/2016 | Muto | ........ H01L 23/49562 |
| | | | | 257/140 |

FOREIGN PATENT DOCUMENTS

| | | | |
|---|---|---|---|
| JP | H06-302734 | A | 10/1994 |
| JP | H07-066340 | A | 3/1995 |
| JP | 2005-183455 | A | 7/2005 |
| JP | 2007-184525 | A | 7/2007 |
| JP | 2008-042039 | A | 2/2008 |
| JP | 2008-098585 | A | 4/2008 |
| JP | 2010-103222 | A | 5/2010 |
| JP | 2010-107432 | A | 5/2010 |
| JP | 2012-229971 | A | 11/2012 |
| JP | 5076440 | B2 | 11/2012 |

\* cited by examiner

Prior Art

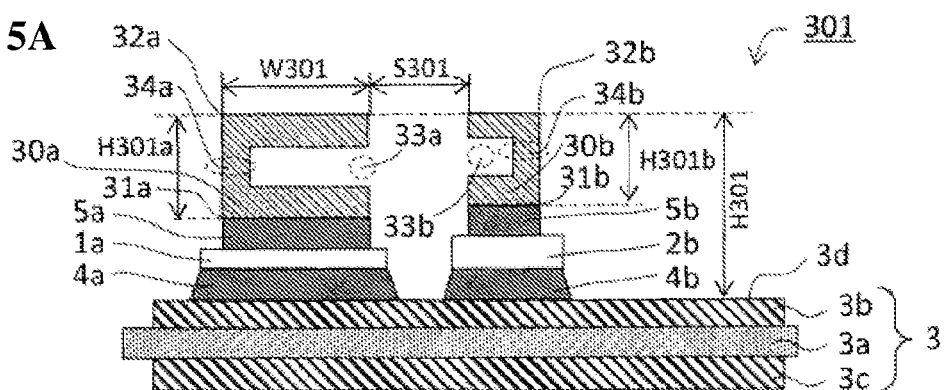
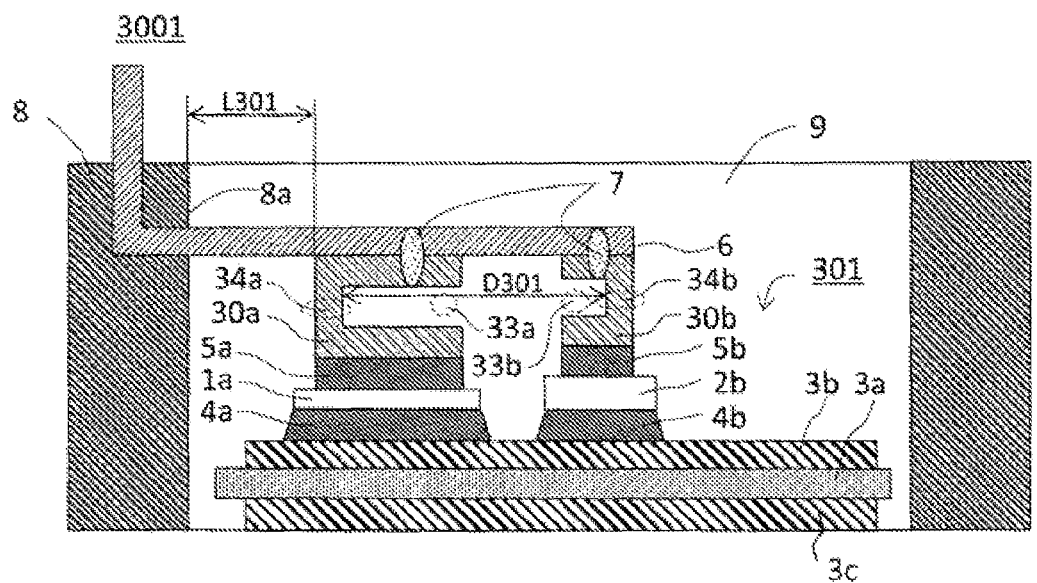

METHOD FOR MANUFACTURING SEMICONDUCTOR MODULE AND INTERMEDIATE ASSEMBLY UNIT OF THE SAME

CROSS-REFERENCES TO RELATED APPLICATIONS

The present application claims priority from Japanese Application No. 2014-233644 filed Nov. 18, 2014, the disclosure of which is incorporated herein.

BACKGROUND OF THE INVENTION

Field of the Invention

The present invention relates to a method for manufacturing a semiconductor module in which two or more semiconductor elements having substrate materials and heights different from each other are mounted together in a mixed manner and to an intermediate assembly unit thereof.

Description of the Related Art

On a manufacturing process of a power semiconductor module structuring a circuit by combining a plurality of semiconductor elements, an intermediate inspection step is generally conducted for electrical characteristics in a state where an intermediate assembly unit is formed before the manufacturing process has been completed.

The Patent Literature 1 describes a switching characteristic test, a surge test, a continuous operation test, and a thermal resistance test performed for power semiconductor elements such as an insulated gate bipolar transistor (IGBT), and a power metal oxide semiconductor field effect transistor (MOSFET). The Patent Literature 2 discloses a method for inspecting switching characteristics of an inverter circuit set in the power semiconductor module.

CITATION LIST

Patent Document

Patent Literature 1: Japanese Unexamined Patent Application Publication No. 2010-107432
Patent Literature 2: Japanese Unexamined Patent Application Publication No. 2012-229971

DISCLOSURE OF THE INVENTION

Problem to be Solved by the Invention

Problems in conventional arts will be described using a drawing.

FIG. 1 schematically shows a method for inspecting a leakage current from a semiconductor element $1a$ assembled in an intermediate assembly unit 100 of the power semiconductor module. Here, both the semiconductor element $1a$ and a semiconductor element $1b$ are vertical-type silicon semiconductor elements in which current flows in the vertical direction. Each rear face of the semiconductor elements $1a$ and $1b$ is joined with solder to first metal foil $3b$ of an insulating substrate 3. On the other hand, front face electrodes of the semiconductor elements $1a$ and $1b$ are joined with solder to a wiring member 10, being connected electrically.

That is, in the conventional inspection method, the semiconductor element $1a$ is connected in parallel with the semiconductor element $1b$ in the intermediate assembly unit 100.

On the other hand, a measuring probe P1 is contacting the wiring member 10 coupling between the semiconductor elements in order to inspect the leakage current. A measuring probe P2 is also contacting the first metal foil $3b$. An inspection of the leakage current is performed so that a current value is determined using an ammeter AM while a voltage is applied between the measuring probes P1 and P2 using a voltage source VS. If the determined current value is less than a predetermined standard value, the product inspected has passed the inspection.

The current value determined by the above inspection indicates the sum of the leakage currents derived from both the semiconductor elements $1a$ and $1b$; therefore, strictly speaking, it is different from inspecting the leakage current of the semiconductor element $1a$. However, if the leakage current of the semiconductor element $1b$ is less than or similar to that of the semiconductor element $1a$, the leakage current is not as large as to change the judgment of the inspection.

However, when the semiconductor elements mounted in the power semiconductor module have substrate materials different from each other, the inspection method described above is not suitable.

For example, when an IGBT element fabricated in a silicon substrate is employed as the semiconductor element $1a$, and a silicon-carbide Schottky barrier diode (SiC-SBD) fabricated in a SiC substrate is employed as the semiconductor element $1b$ in FIG. 1, a leakage current of the SiC-SBD is larger by one or more digits in magnitude than that of the IGBT. Then even though one IGBT element has a large leakage current and should be classified as a defective element, the element cannot be detected by the inspection described above. The reason for the large leakage current of the SiC-SBD is due to the difficulty of obtaining the SiC substrate with low defect density indicating good quality. However, the SiC-SBD comprises superior characteristics such as high thermal withstand, high withstand voltage, and low loss, thus, market expansion is greatly expected in the future.

Therefore, it is an object of the present invention to provide a method for manufacturing a semiconductor module which can exclude a defective element having a large leakage current with certainty, and an intermediate assembly unit thereof on the power semiconductor module mounting two or more semiconductor elements having substrate materials and heights different from each other together in a mixed manner.

Means for Solving Problem

In order to achieve the object described above, in a state where two or more semiconductor elements having substrate materials and heights different from each other have been joined with solder to metal foil located at one side of an insulating substrate with the metal foil, and each one of a plurality of wiring members with which the semiconductor elements are not interconnected has been connected to each one of front face electrodes of the semiconductor elements through solder, there is provided a method for manufacturing a semiconductor module comprising the steps of: connecting each one of the plurality of wiring members to each one of the semiconductor elements so that the heights from a surface of the insulating substrate to the top faces of the wiring members become the same level with each other; inspecting a leakage current while applying electricity on each of semiconductor elements individually through the wiring members; and connecting between the top faces of the wiring members with a bus bar.

According to the method for manufacturing the semiconductor module of the present invention, the inspection of the leakage current can be conducted while applying electricity on each semiconductor element individually through each wiring member with which the semiconductor elements are not interconnected. Then, for example, even though both a silicon-carbide semiconductor element and a silicon semiconductor element are mounted together in a mixed manner, each leakage current of the semiconductor elements can be determined accurately, allowing a defective semiconductor element to be detected with certainty. Then, unnecessary subsequent steps can be omitted for the semiconductor module mounting the defective semiconductor element.

Furthermore, in the state where the wiring members have been connected to the front face electrodes of the semiconductor elements through solder, the wiring members are connected so that the heights from the surface of the insulating substrate to the top faces of the wiring members become the same level with each other. Then when the top faces of the wiring members are connected to the bus bar, the height of the connecting points can be kept to be uniform in height with each other through the process connecting the wiring members. This can result in improvement of workability.

According to one aspect of the method for manufacturing the semiconductor module of the present invention, it is preferable that a height from the bottom face to the top face of each of the wiring members is predetermined individually corresponding to each height of the semiconductor elements so that the heights from the surface of the insulating substrate to the top faces of the wiring members become the same level with each other.

According to the one aspect of the invention described above, even though the solder thickness is constant, each height of the top faces of the wiring members connected to each of the semiconductor elements individually can be arranged to become the same level by changing the height of each wiring member in response to the height of the semiconductor element, thus, allowing a soldering condition to be controlled easily.

According to another aspect of the method for manufacturing the semiconductor module of the present invention, it is preferable that a thickness of each of solder connecting between the wiring member and the front face electrode of the semiconductor element has a predetermined thickness corresponding to each height of the semiconductor elements so that the heights from the surface of the insulating substrate to the top faces of the wiring members become the same level with each other.

According to the aspect of the invention described above, even if the wiring members are uniform in height, each height of the top faces of the wiring members connected to each of the semiconductor elements individually can be arranged to become the same level by changing the thickness of each solder in response to the height of the semiconductor element; thus, resulting in standardization of the wiring member in height, allowing the management of the parts to become easy.

According to the method for manufacturing the semiconductor module of the present invention, it is preferable that laser beam welding is employed to connect the wiring members to the bus bar in the step of connecting the wiring members.

According to the aspect of the invention described above, the process connecting between the wiring members and the bus bar can be completed during heating locally without touching because of the laser beam welding. Then the connecting process can be performed without melting the place joined with solder already. Thus this allows the connecting process to proceed in a short time, resulting in a higher efficiency of workability.

According to the method for manufacturing the semiconductor module of the present invention, it is preferable that the wiring members and/or the bus bar have a structure and material with spring property.

According to the aspect of the invention described above, since the wiring members and/or the bus bar have the structure and the material with spring property, the wiring members and/or the bus bar can be deformed elastically to adhere with each other when the bus bar is about to be connected to the wiring members, allowing the connection to be performed with certainty.

According to the method for manufacturing the semiconductor module of the present invention, it is preferable that at least one semiconductor element is a silicon-carbide semiconductor element, and the other semiconductor element is a silicon semiconductor element.

As described earlier, the silicon-carbide semiconductor element has the leakage current different from the silicon semiconductor element by one or more digits in magnitude. According to the present invention, since the leakage current can be determined individually for each semiconductor element, a defective element classified by the leakage current can be detected for respective semiconductor elements with certainty. Thus, the power semiconductor module with superior performance and reliability can be manufactured.

There is provided an intermediate assembly unit of a semiconductor module comprising: an insulating substrate with metal foil; two or more semiconductor elements, which are joined with solder to metal foil connected to one side of the insulating substrate, having substrate materials and heights different from each other; a plurality of wiring members with each one of which the semiconductor elements are not interconnected, wherein the heights from a surface of the insulating substrate to the top faces of the wiring members become the same level with each other in a state where each wiring member has been connected to each one of front face electrodes of the semiconductor elements through solder; and a bus bar connecting between the top faces of the wiring members.

According to the intermediate assembly unit of the semiconductor module of the present invention, the leakage current can be inspected while applying electricity on each semiconductor element individually through the wiring members. Then even though both a silicon-carbide semiconductor element and a silicon semiconductor element are mounted together in a mixed manner, each leakage current of the semiconductor elements can be determined accurately, allowing a defective semiconductor element to be detected certainly. Thus, unnecessary subsequent steps can be omitted for the unit mounting the defective semiconductor element.

Furthermore, in the state where the wiring members have been connected to the front face electrodes of the semiconductor elements through solder, the wiring members are connected so that the heights from the surface of the insulating substrate to the top faces of the wiring members become the same level with each other. Then this allows the height of connecting points to keep uniform with each other in the course of the process connecting the top faces of the wiring members to the bus bar, which can result in improvement of workability.

According to one aspect of the intermediate assembly unit of the semiconductor module of the present invention, it is preferable that each height from the bottom to the top faces of the wiring members is determined individually corresponding to the height of the semiconductor element so that the heights from the surface of the insulating substrate to the top faces of the wiring members become the same level with each other.

According to the one aspect of the invention described above, the height of the wiring member can be changed corresponding to the height of the semiconductor element. Then, even though the solder has a constant dimension in thickness, the top faces of the wiring members connected to each one of semiconductor elements can be arranged to keep uniform in height. This allows the soldering condition to be controlled easily.

According to another aspect of the intermediate assembly unit of the semiconductor module of the present invention, it is preferable that each solder connecting the wiring member to the front face electrode of the semiconductor element has a thickness corresponding to the height of the semiconductor element so that the heights from the surface of the insulating substrate to the top faces of the wiring members become the same level with each other.

According to the aspect of the invention described above, even though the wiring members have a constant dimension in height, the top faces of the wiring members connected to each semiconductor element can be arranged to keep uniform in height by changing the solder thickness corresponding to the height of the semiconductor element; thus, resulting in standardization of the wiring member in height, allowing the management of parts to become easy.

According to the intermediate assembly unit of the semiconductor module of the present invention, it is preferable that the wiring members and/or the bus bar have a structure and material with spring property.

According to the aspect of the invention described above, since the wiring members and/or the bus bar have the structure and the material with spring property, the wiring members and/or the bus bar can be deformed elastically to adhere with each other when the bus bar is about to be connected to the wiring members, allowing the connection to be performed with certainty.

According to the intermediate assembly unit of the semiconductor module of the present invention, it is preferable that at least one semiconductor element is a silicon-carbide semiconductor element, and the other semiconductor element is a silicon semiconductor element.

According to the aspect of the invention described above, the leakage current defectives can be detected with certainty in the course of manufacturing process. Thus, this can provide the intermediate assembly unit for manufacturing the power semiconductor module with superior performance and reliability.

According to the present invention, the inspection of the leakage current can be performed while applying electricity on each semiconductor individually through the wiring members. Then the leakage current can be determined accurately for each semiconductor element, and a defective among the semiconductor elements can be detected certainly. Then, unnecessary subsequent steps can be omitted for the unit mounting the defective semiconductor element.

Moreover, in the state where the wiring members have been connected to the front face electrode of the semiconductor elements through solder, the wiring members are connected so that the heights from the surface of the insulating substrate to the top faces of the wiring members become the same level with each other. Then the heights of connecting points can be kept to be at the same level with each other in the course of the process connecting the top faces of the wiring members to the bus bar. This can result in improvement of workability.

BRIEF DESCRIPTION OF THE DRAWINGS

FIGS. 5A, 5B are schematic cross section views according to another embodiment of the power semiconductor module of the present invention;

DESCRIPTION OF PREFERRED EMBODIMENTS

Hereinafter, embodiments according to the present invention will be described based upon the drawings.

Figure 1:
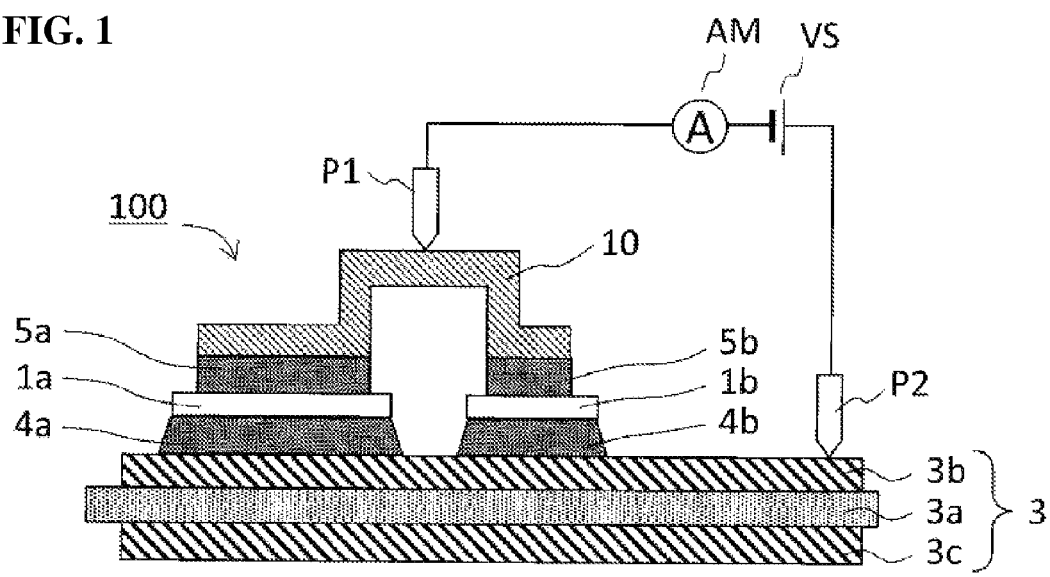
FIG. 1 is a schematic view showing an example of a conventional method for inspecting a power semiconductor module.
Figure 2A:
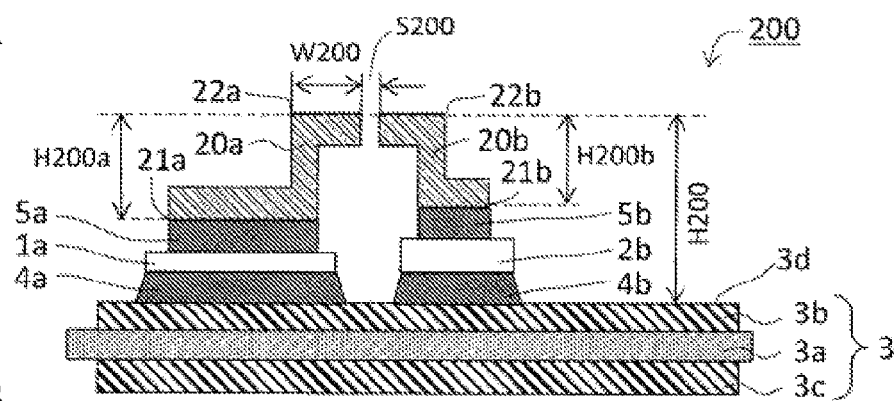
FIGS. 2A, 2B are schematic cross section views according to an embodiment of a power semiconductor module of the present invention.

FIG. 2A shows schematically a cross section of an intermediate assembly unit 200 according to the present invention.

Semiconductor elements 1a and 2b have substrate materials and heights different from each other. Here, as a matter of convenience, it will be described in the case that the semiconductor element 1a has a height lower than the semiconductor element 2b.

According to the present invention, the rear faces of the semiconductor elements 1a and 2b are connected to first metal foil 3b of an insulating substrate 3 through solder 4a and solder 4b, respectively. Furthermore, a front face electrode of the semiconductor element 1a is connected to a wiring member 20a through solder 5a, and another front face electrode of the semiconductor element 2b to a wiring member 20b through solder 5b. However, the wiring members 20a and 20b including some parts not shown in the drawing are electrically isolated from each other.

Although the semiconductor element 1a has a height lower than that of the semiconductor element 2b, a height H200a from the bottom face 21a to the top face 22a of the wiring member 20a is formed higher than a height H200b from the bottom face 21b to the top face 22b of the wiring member 20b. Then the top face 22a of the wiring member 20a is structured so as to become the same level in height with the top face 22b of the wiring member 20b from a surface 3d of the insulating substrate.

Figure 2B:
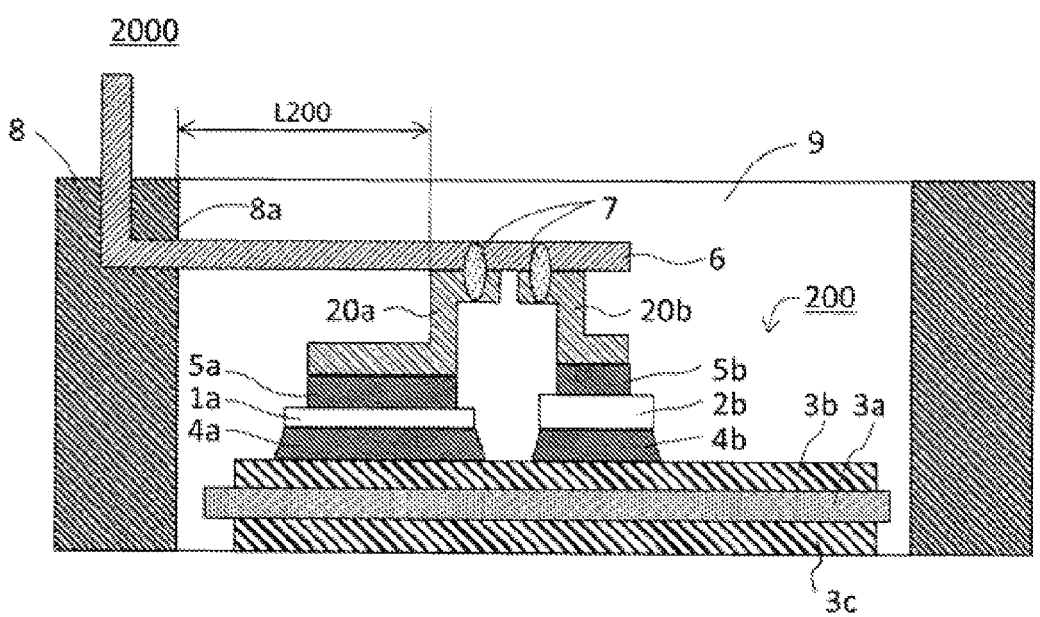

FIG. 2B shows schematically a cross section of a power semiconductor module 2000 in which the intermediate assembly unit 200 is built. A bus bar 6 is connected to the wiring members 20a and 20b by using laser beam welding and the like. The intermediate assembly unit 200 is stored in a resin case 8 in which sealing resin 9 is filled.

According to the aspect of the present invention described above, the wiring member 20a is electrically isolated from the wiring member 20b of the intermediate assembly unit 200. Then each leakage current of semiconductor elements 1a and 2b can be inspected individually, allowing a defective element to be detected with certainty.

Moreover, according to the aspect of the present invention described above, the heights are adjusted so that the top face 22a of the wiring member 20a becomes the same level with the top face 22b of the wiring member 20b. Then a time-consuming job for adjusting the focus depth of laser-light in every connection points can be saved when the bus bar 6 is welded by using laser. This allows the connection process to be performed efficiently.

Hereinafter, each part of the power semiconductor module 2000 will be elaborated further.

Although the types of semiconductor elements 1a and 2b are not particularly limited, for example, an IGBT or a power MOSFET fabricated in a silicon substrate as the semiconductor element 1a and a SiC-SBD or a SiC-MOSFET fabricated in a silicon-carbide substrate as the semiconductor element 2b can be employed to structure an inverter circuit and a converter circuit.

The insulating substrate 3 includes an insulating plate 3a, the first metal foil 3b, and second metal foil 3c. The semiconductor elements 1a and 2b can be joined to the first metal foil 3b with solder. On the other hand, a heat spreader or a cooler not shown can be joined to the second metal foil 3c with solder. The material required for the insulating plate 3a is not particularly limited as long as the insulating material has good thermal conduction. For example, the materials such as aluminum nitride, silicon nitride, and alumina can be employed. Further, the material required for the metal foils 3b and 3c is not particularly limited as long as the material has good electrical conduction and thermal conduction. Specifically, copper is preferable, and for reducing the cost, it is preferable to form the copper foil to the insulating plate 3a by direct copper bonding (DCB).

The wiring members 20a and 20b are not particularly limited as long as the material has good electrical conduction. For example, a member in which a copper plate with tin plating is bent into a crank like shape to have a spring property can be used. If the member has a spring property, the wiring member can be deformed elastically to adhere tightly to the bus bar 6 in the course of connecting the bus bar to the wiring members, allowing the connection to become certain. However, in the case that the wiring members 20a and 20b have cross sections with a crank like shape as shown in FIGS. 2A, 2B, if a space S200 separating between the wiring members 20a and 20b is not secured sufficiently, the wiring member 20a may deform elastically to contact the wiring member 20b when a measuring probe P1 is contacting the wiring member 20a, which may cause an electrical short circuit. Furthermore, if a width W200 of the top face 22a of the wiring member 20a is narrow, aligning the measuring probe P1 becomes difficult. Thus, the interval between the semiconductor elements 1a and 2b is preferably designed by considering the largeness of the elastic deformation of the wiring member and the accuracy of the alignment of the measuring probe P1.

The material required for the bus bar 6 is not particularly limited, and preferably has spring property and excellent electrical conduction. Specifically, copper, copper alloys, aluminum, and aluminum alloys are primarily preferable.

The process for connecting between the bus bar 6 and the wiring members 20a and 20b is preferably performed using laser beam welding. When the laser beam welding is performed, it is preferable that a surface of the bus bar 6 is plated with nickel in order to increase the absorption efficiency of laser light. Moreover, the bus bar 6 may have slit holes or dimples to partially reduce rigidity, to have spring property. The structure having a spring property allows the bus bar to elastically deform to adhere to the wiring members with each other in the course of connecting the bus bar to the wiring members, which allows the welding to be performed reliably.

Next, a method for manufacturing the power semiconductor module 2000 will be described.

(Assembly Process 1)

The rear faces of the semiconductor elements 1a and 2b, in which the substrate materials are different from each other, are joined to the first metal foil 3b of the insulating substrate 3 with solder.

(Assembly Process 2)

The wiring members 20a and 20b are joined with solder to the front face electrodes of the semiconductor elements 1a and 2b, respectively, forming the intermediate assembly unit 200.

The assembly processes 1 and 2 maybe combined into one process, in which the soldering can be performed with one heating treatment.

(Inspection Process 1)

The electrical characteristics of the intermediate assembly unit 200 assembled by the sequence described above is inspected such as the leakage current and so on. Each unit that has passed the inspection among the intermediate assembly units 200 can go forward to an assembly process 3.

(Assembly Process 3)

The intermediate assembly unit 200 is assembled into a resin case 8, and then the bus bar 6 is connected to the wiring members 20a and 20b.

According to the present invention, a method for connecting the bus bar 6 with the wiring members 20a and 20b is not particularly limited. For example, a laser weld portion 7 can be formed so that $Nd^{3+}YAG$ laser beam is irradiated to a place to be connected, at which the wiring members and the bus bar are heated locally. The use of the laser beam welding allows local heating in a noncontact manner, thus, permitting the connection to be performed without melting the points soldered already. The use of laser beam welding provides efficient workability because the connection can be performed in a short time.

The bus bar 6 maybe a separate respective part, and be connected individually. The bus bar 6 may also be casted into the resin case 8 and assembled to the intermediate assembly unit 200 along with the resin case. This allows the bus bar to be aligned accurately toward the wiring members, allowing the laser beam welding to become easier.

(Inspection Process 2)

After the semiconductor elements 1a and 2b have been connected by using the bus bar 6, other items can be inspected as necessary. For example, such as a characteristic test of the inverter circuit can be conducted in a state where the semiconductor elements are connected with each other.

(Assembly Process 4)

A sealing resin 9 is filled into the resin case 8 to form a power semiconductor module 2000.

The above description shows an outline of the method for manufacturing the power semiconductor module; however, processes omitted from the above description include the steps of such as primarily wire-bonding of a gate electrode of the IGBT, soldering the intermediate assembly unit 200 to a heat-sink, inspecting the soldered part using X-ray, etc.

Hereinafter, the inspection process 1 in which the leakage current is inspected will be described in detail.

Figure 3A:
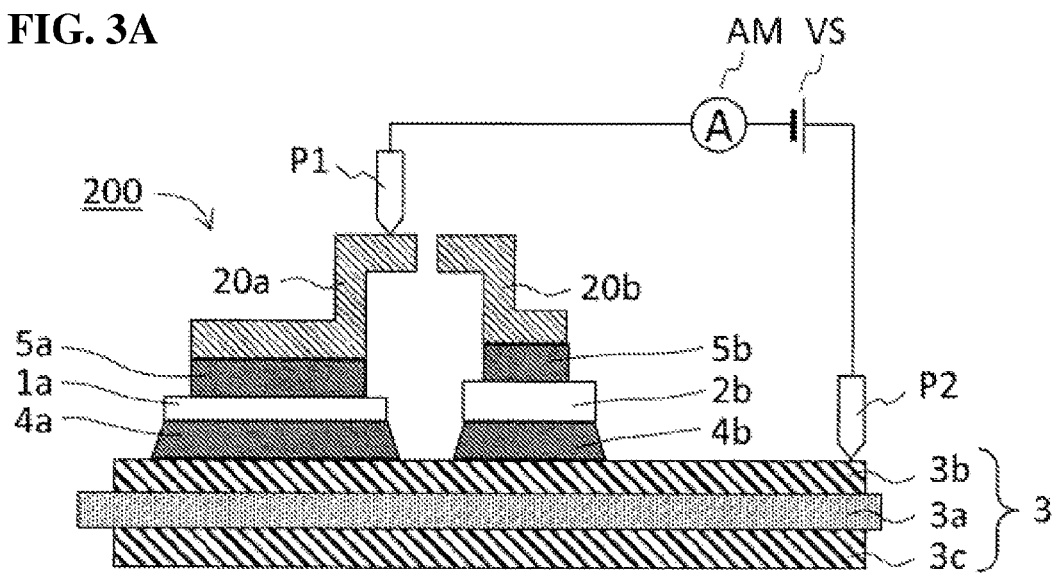
FIGS. 3A, 3B are schematic views showing an example of a method for inspecting the power semiconductor module of the present invention.

FIG. 3A shows a method for inspecting a leakage current of the semiconductor element 1a mounted on the intermediate assembly unit 200 according to the present invention. The measuring probe P1 is contacting the wiring member 20a connected to the semiconductor element 1a. The measuring probe P2 is also contacting the metal foil 3b. The inspection of the leakage current is performed so that a voltage is applied between the measuring probes P1 and P2 by using voltage source VS, and then a current value can be determined using an ammeter AM. If the current value determined is less than a predetermined standard value, the specimen inspected has passed the inspection. Since the wiring members 20a and 20b are isolated electrically from each other, no current will flow to the semiconductor element 2b. Thus, the leakage current of the semiconductor element 1a can be inspected accurately.

Figure 3B:
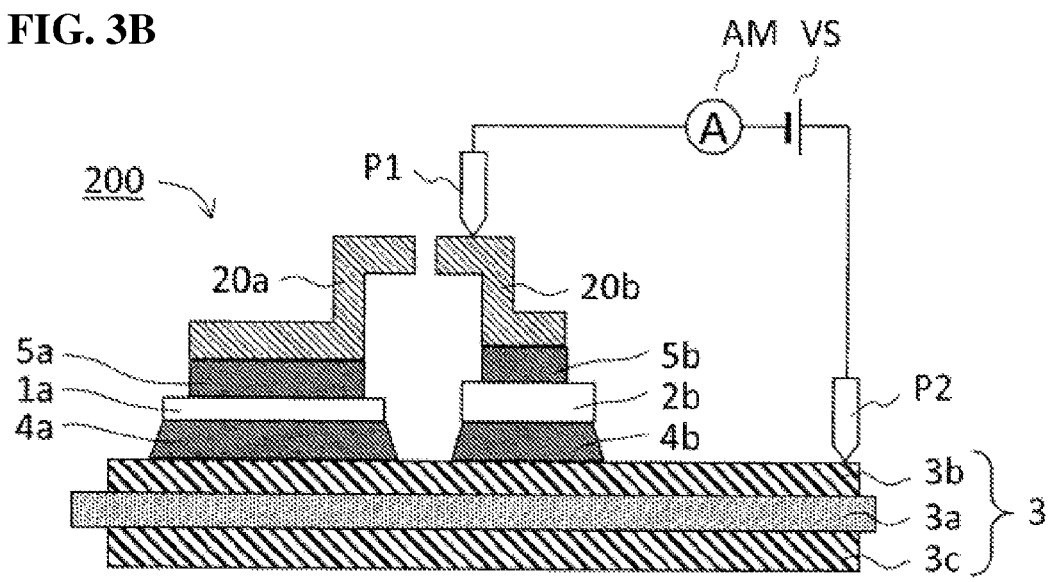

According to a method illustrated in FIG. 3B, a leakage current of the semiconductor element 2b can be also inspected as necessary. The measuring probe P1 is contacting the wiring member 20b connected to the semiconductor element 2b. Moreover, the measuring probe P2 is contacting the metal foil 3b. The inspection of the leakage current is performed so that a voltage is applied between the measuring probes P1 and P2 using the voltage source VS, and then a current value can be determined using the ammeter AM.

According to the present invention, two or more semiconductor elements have the substrate materials different from each other, and then the leakage currents thereof vary by one or more digits in magnitude. Even though the two or more semiconductor elements are mounted together in a mixed manner, the leakage current can be determined in a state where the semiconductor elements are isolated electrically from each other, which allows the defective element to be detected surely.

Figure 4A:
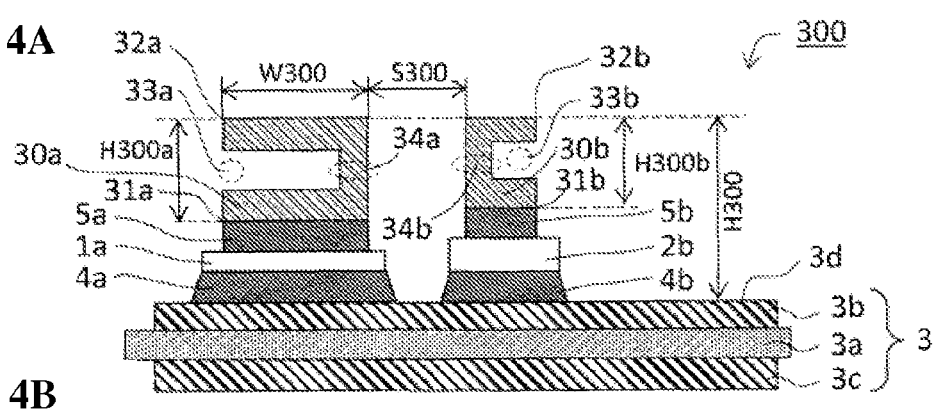
FIGS. 4A, 4B are schematic cross section views according to another embodiment of the power semiconductor module of the present invention.
Figure 4B:
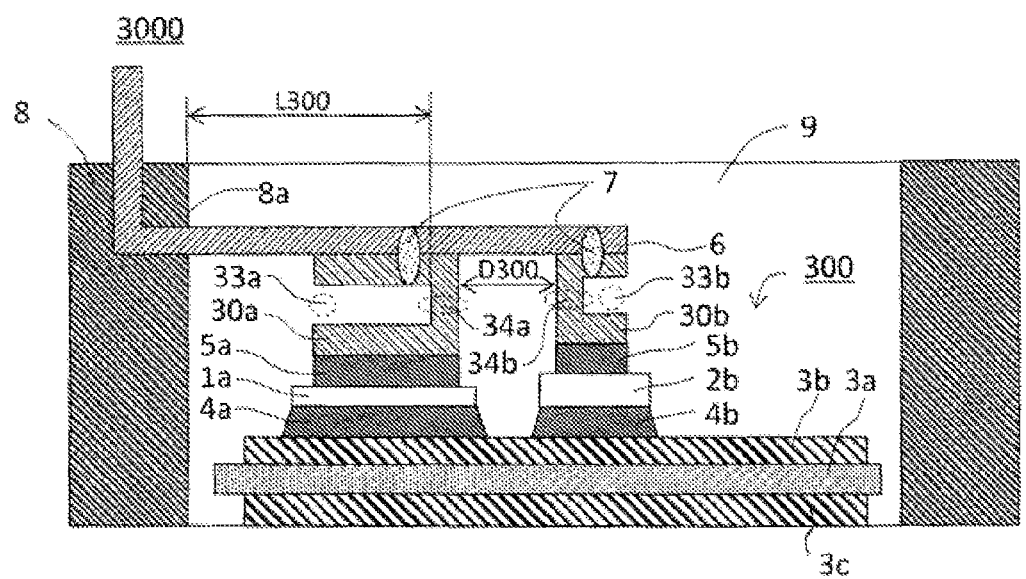

According to another embodiment of the present invention, FIGS. 4A and 4B illustrate another intermediate assembly unit and another power semiconductor module, respectively. In a power semiconductor module 3000, wiring members 30a and 30b have cross sections formed similarly to a U-shape and are disposed so as to avoid overhanging the outer edge of the semiconductor element.

This constitution allows a space S300 separating the wiring member 30a from the wiring member 30b to become larger than the space S200 shown in FIG. 2A. Simultaneously, when the wiring member is folded back, the top face width W300 of the wiring member 30a with which the measuring probe P1 is contacting can also become bigger than the width W200 shown in FIG. 2A. As a result, a short circuit occurs hardly between the wiring members, and the probe can be aligned easier.

Moreover, as shown in the drawings, in the case that the height of the semiconductor element 1a is lower than that of the semiconductor element 2b, a height H300a of the wiring member 30a can be preferably set to be higher than a height H300b of the wiring member 30b. When the height from the surface 3d of the insulating substrate 3 is structured to become the same level between the top surface 32a of the wiring member 30a and the top surface 32b of the wiring member 30b, it is preferable that the bus bar 6 can be connected efficiently as described earlier.

Further, the wiring member 30a is preferably attached so that an open portion 33a of the U-shape is facing an inner face 8a of the resin case located at the side where the bus bar 6 is casted. Then the wiring members 30b is preferably attached to the wiring members 30a so as to be arranged in a back to back manner, and then connection portions 34a and 34b of the U-shape are preferably attached so as to be adjacent with each other.

When attached as mentioned above, an advantage can be recognized easily in comparison with FIGS. 5A, 5B described below.

FIG. 5B shows a schematic cross section of a power semiconductor module 3001 in which the connection portion 34a having a U-shape of the wiring member 30a is attached so as to face the inner face 8a of the resin case located at the side where the bus bar 6 is casted, and the open portions 33b and 33a of the U-shape of the wiring member 30b are attached so as to face each other.

The length from the inner face 8a of the resin case to the connection portion 34a having the U-shape of the wiring member 30a is indicated as L300 in FIG. 4B and as L301 in FIG. 5B. As shown clearly in the drawings, since length L300 is longer than length L301, the bus bar 6 warps more likely in an attachment style shown in FIG. 4B than in that shown in FIG. 5B, thus, allowing the stress applied to the semiconductor element 1a to decrease.

Further, the distance between the connection portions 34a and 34b is indicated as D300 in FIG. 4B and as D301 in FIG. 5B. As shown clearly in the drawings, the distance D300 is shorter than the distance D301, which indicates that electric resistance between the semiconductor elements can be made smaller in the structure attached as shown in FIG. 4B than in that shown in FIG. 5B.

Based upon the above two reasons, the direction in which the wiring members 30a and 30b are attached is more preferable in the attachment style shown in FIGS. 4A, 4B than in that shown in FIGS. 5A, 5B.

Figure 6A:
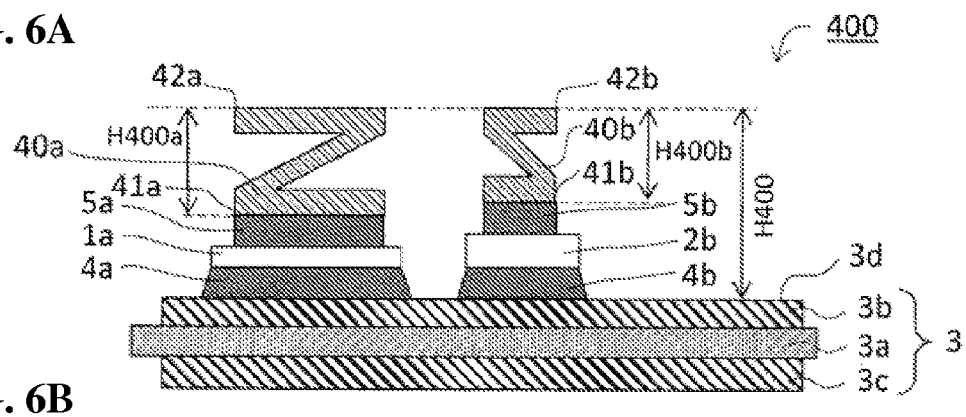
FIGS. 6A, 6B are schematic cross section views according to another embodiment of the power semiconductor module of the present invention.
Figure 6B:
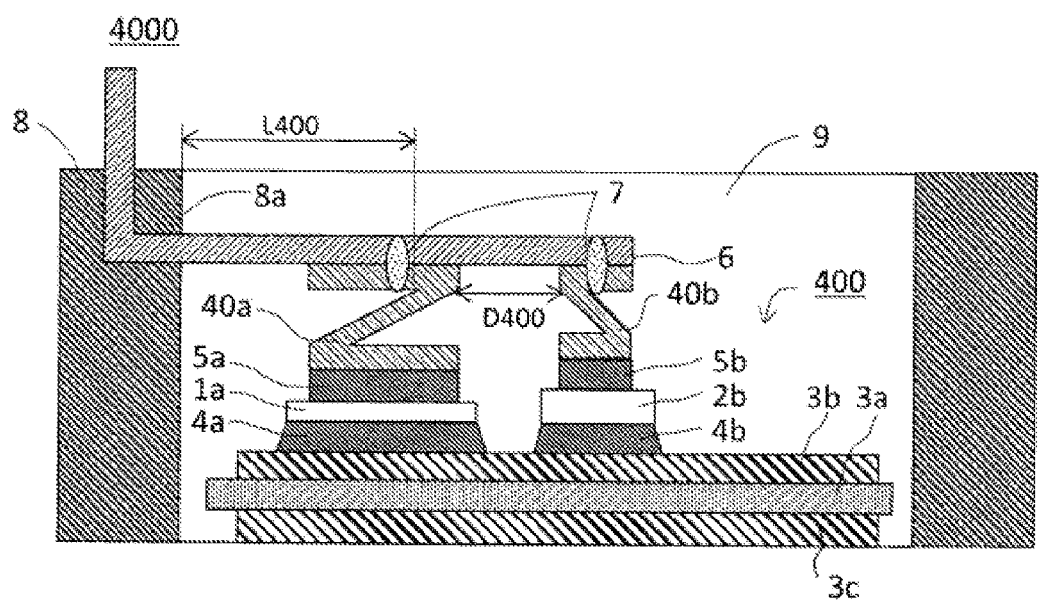

FIGS. 6A and 6B show another intermediate assembly unit and another power semiconductor module according to another embodiment of the present invention, respectively.

A power semiconductor module 4000 is equipped with wiring members 40a and 40b having cross sections formed similarly to a Z-shape.

As shown in the drawings, in the case that the semiconductor element 1a has a height lower than the semiconductor element 2b, a height H400a of the wiring member 40a can be preferably set to be higher than a height H400b of the wiring member 40b. When the heights from the insulating substrate surface 3d are structured so as to become the same level between the top surface 42a of the wiring member 40a and the top surface 42b of the wiring member 40b, it is preferable that the bus bar 6 can be connected efficiently as described earlier.

Furthermore, as shown in FIGS. 6A, 6B, when the wiring member 40a is attached so that the wiring member 40a having a Z-shape whose bent part near to bus bar side is positioned far from the inner face 8a of the resin case located at the side where the bus bar is casted, the length L400 can be made longer, allowing the stress applied to the semiconductor element to be relieved more largely. Further, when the wiring member 40b is attached in the direction so that the Z-shape is laterally inverted, the distance D400 can be made shorter, reducing the electric resistance between the semiconductor elements.

Figure 7A:
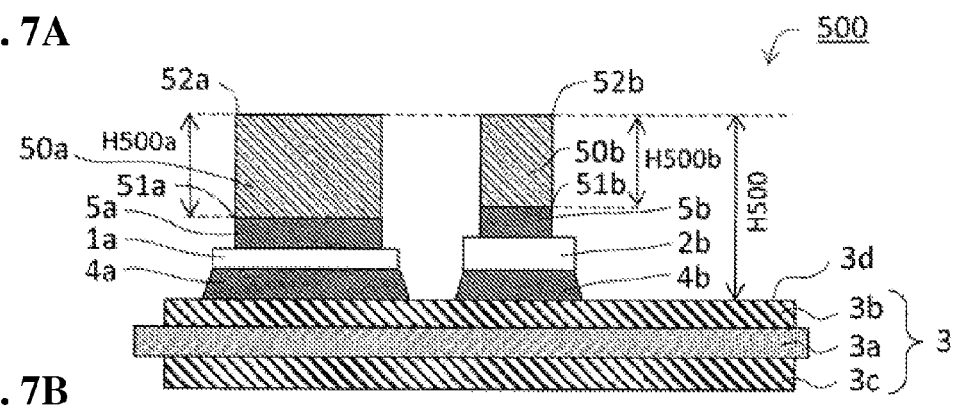
FIGS. 7A, 7B are schematic cross section views according to another embodiment of the power semiconductor module of the present invention.
Figure 7B:
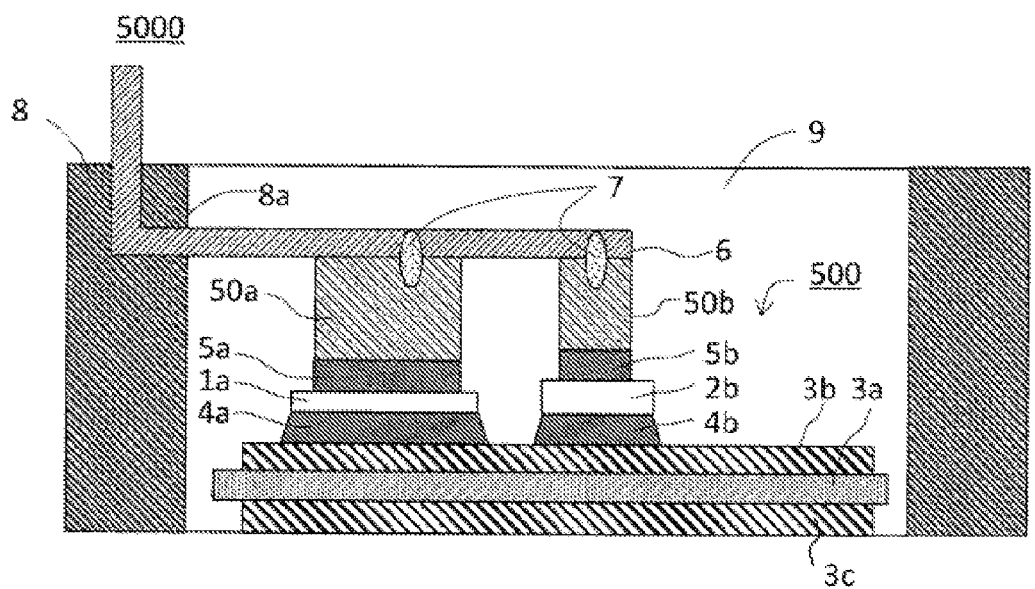

FIGS. 7A and 7B show another intermediate assembly unit and another power semiconductor module according to the embodiment of the present invention, respectively.

Wiring members 50a and 50b formed into a block shape are employed for a power semiconductor module 5000. With the block-shaped members, the heat conduction area increases to transfer heat efficiently, thus, permitting heat capacity to increase, decreasing transient thermal resistance.

As shown in the drawings, in the case that the semiconductor element 1a has a height lower than that of the semiconductor element 2b, a height H500a of the wiring member 50a can be preferably set to be higher than a height H500b of the wiring member 50b. When the heights from the surface 3d of the insulating substrate are formed so as to become the same level between the top surface 52a of the wiring member 50a and the top surface 52b of the wiring member 50b, it is preferable that the bus bar 6 is connected efficiently as described earlier.

Figure 8A:
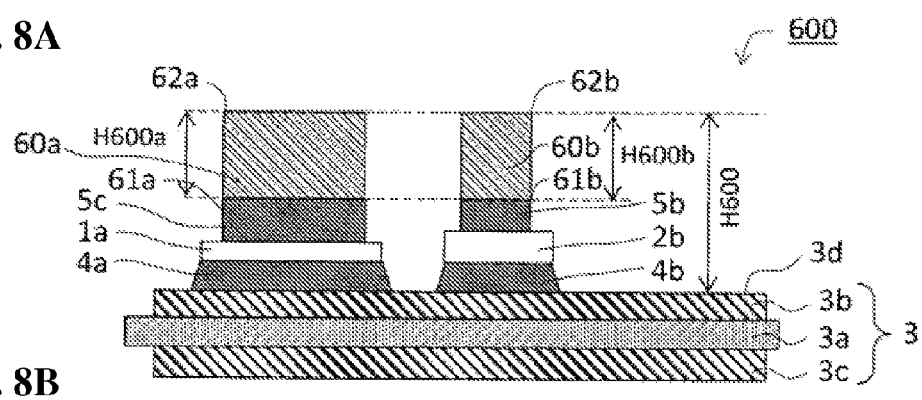
FIGS. 8A, 8B are schematic cross section views according to another embodiment of the power semiconductor module of the present invention.
Figure 8B:
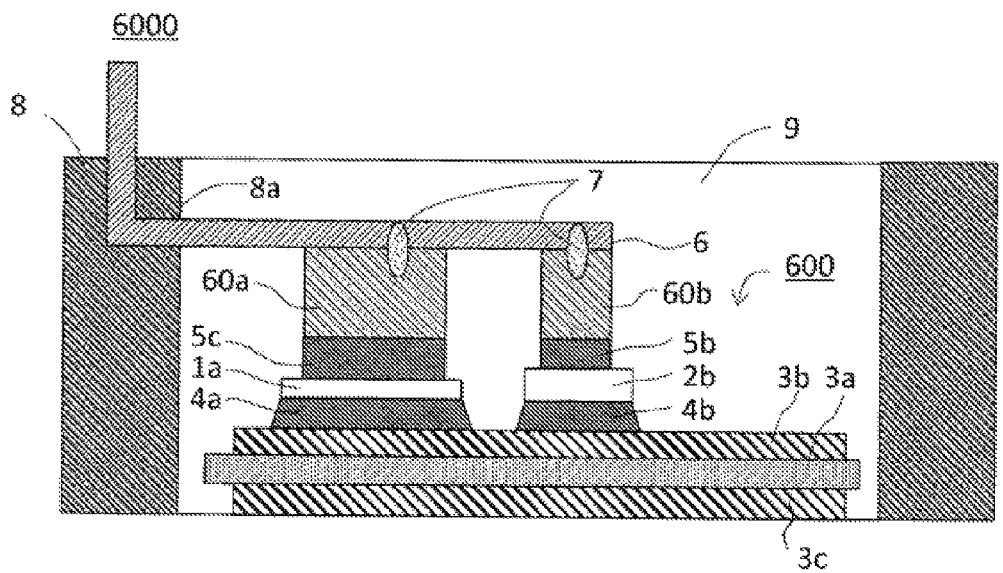

FIGS. 8A and 8B show another intermediate assembly unit and another power semiconductor module according to the embodiment of the present invention, respectively.

For a power semiconductor module 6000, a height H600a of a wiring member 60a is set to be identical with a height H600b of a wiring member 60b. Regarding the height gap between the semiconductor elements 1a and 2b, solder 5c connecting between the top face of the semiconductor element 1a and the bottom face 61a of a wiring member 60a is formed to increase in thickness so that the heights from the surface 3d of the insulating substrate 3 become the same level between the top face 62a of the wiring member 60a and the top face 62b of the wiring face 60b. Such the constitution preferably allows the bus bar 6 to be connected efficiently.

In addition, the height adjustment described above may be conducted by changing the thicknesses of the solder 4a, the solder 4b, or the solder 5b.

EXPLANATION OF REFERENCE NUMERALS 1a, 1b, 2b: semiconductor element
3: insulating substrate
3a: insulating plate
3b: first metal foil
3c: second metal foil
4a, 4b, 5a, 5b, 5c: solder
6: bus bar
7: laser weld portion
8: resin case
8a: inner face of resin case in which bus bar is casted
9: sealing resin
10: wiring member (coupling between semiconductor elements)
20a, 20b, 30a, 30b, 40a, 40b, 50a, 50b, 60a, 60b: wiring member (not coupling between semiconductor elements)
21a, 21b, 31a, 31b, 41a, 41b, 51a, 51b, 61a, 61b: bottom face of wiring member
22a, 22b, 32a, 32b, 42a, 42b, 52a, 52b, 62a, 62b: top face of wiring member
33a, 33b: open portion of wiring member formed into figure of U shape
34a, 34b: connection portion of wiring member formed into figure of U shape
100, 200, 300, 400, 500, 600: intermediate assembly unit
2000, 3000, 4000, 5000, 6000: power semiconductor module
P1, P2: measuring probe
VS: voltage source
AM: ammeter
D300, D301: distance between two connection portions of wiring members formed into figure of U shape
H200, H300, H301, H400, H500, H600: height from surface of insulating substrate to wiring member
H200a, H200b, H300a, H300b, H301a, H301b, H400a, H400b, H500a, H500b, H600a, H600b: height of wiring member
L300, L301: length from inner face of resin case to connection portion of wiring member formed into figure of U shape
S200, S300, S301: space between wiring members
W200, W300, W301: top face width of wiring member with which measuring probe is in contact

What is claimed is:

1. A method for manufacturing a semiconductor module comprising the step of:
    soldering two or more semiconductor elements having substrate materials and heights different from each other to a metal foil disposed at one side of an insulating substrate;
    connecting a plurality of wiring members, not interconnecting the semiconductor elements, to front face electrodes of the semiconductor elements through solder so that heights from a surface of the insulating substrate to top faces of the wiring members become same level with each other;
    inspecting a leakage current while applying electricity on each of the semiconductor elements individually through the wiring members; and
    connecting the top faces of the wiring members with a bus bar.

2. The method for manufacturing the semiconductor module according to claim 1, wherein a height from a bottom face to the top face of each of the wiring members is predetermined individually corresponding to each height of the semiconductor elements so that the heights from the surface of the insulating substrate to the top faces of the wiring members become the same level with each other.

3. The method for manufacturing the semiconductor module according to claim 2, wherein the wiring members and/or the bus bar have a structure and material with spring property.

4. The method for manufacturing the semiconductor module according to claim 2, wherein at least one semiconductor element is a silicon-carbide semiconductor element, and another semiconductor is a silicon semiconductor element.

5. The method for manufacturing the semiconductor module according to claim 1, wherein a thickness of each solder connecting between each wiring member and each front face electrode of the semiconductor elements has a predetermined thickness corresponding to each height of the semiconductor elements so that the heights from the surface of the insulating substrate to the top faces of the wiring members become the same level with each other.

6. The method for manufacturing the semiconductor module according to claim 5, wherein the wiring members and/or the bus bar have a structure and material with spring property.

7. The method for manufacturing the semiconductor module according to claim 5, wherein at least one semiconductor element is a silicon-carbide semiconductor element, and another semiconductor is a silicon semiconductor element.

8. The method for manufacturing the semiconductor module according to claim 1, wherein laser beam welding is employed to connect the wiring member to the bus bar in the step of connecting the plurality of wiring members.

9. The method for manufacturing the semiconductor module according to claim 1, wherein the wiring members and/or the bus bar have a structure and material with spring property.

10. The method for manufacturing the semiconductor module according to claim 1, wherein at least one semiconductor element is a silicon-carbide semiconductor element, and another semiconductor is a silicon semiconductor element.

* * * * *

UNITED STATES PATENT AND TRADEMARK OFFICE
CERTIFICATE OF CORRECTION

PATENT NO. : 9,741,628 B2
APPLICATION NO. : 14/877334
DATED : August 22, 2017
INVENTOR(S) : Kenichiro Sato It is certified that error appears in the above-identified patent and that said Letters Patent is hereby corrected as shown below:

In the Specification

Please change Column 7, Line 25, from "... element la and ..." to --... element 1a and ...--.

Please change Column 8, Line 28, from "... maybe combined ..." to --... may be combined ...--.

Please change Column 8, Line 53, from "... bus bar 6 maybe ..." to --... bus bar 6 may be ...--.

Signed and Sealed this
Twenty-fourth Day of October, 2017

Joseph Matal
*Performing the Functions and Duties of the*
*Under Secretary of Commerce for Intellectual Property and*
*Director of the United States Patent and Trademark Office*